United States Patent [19]
Bergfried et al.

[11] Patent Number: 4,951,176
[45] Date of Patent: Aug. 21, 1990

[54] HOLDER SYSTEM FOR FREE-STANDING ELECTRONIC COMPONENTS, ESPECIALLY HYBRID MODULES

[75] Inventors: Dietrich Bergfried, Böblingen; Gert Jakob, Stuttgart; Hans-Heinrich Maue, Bietigheim-Bissingen; Uwe Schaub, Vaihingen/Enz; Walter Roethlingshoefer; Ulrich Goebel, both of Reutlingen; Elmar Huber, Pliezhausen; Roland Schmid, Dettingen; Gerhard Zucker, Reutlingen, all of Fed. Rep. of Germany

[73] Assignee: Robert Bosch GmbH, Stuttgart, Fed. Rep. of Germany

[21] Appl. No.: 360,353

[22] Filed: Jun. 2, 1989

[30] Foreign Application Priority Data

Dec. 30, 1988 [DE] Fed. Rep. of Germany ....... 3844310

[51] Int. Cl.$^5$ .............................................. H05K 7/02
[52] U.S. Cl. .................. 361/400; 174/138 G; 211/41; 361/417; 361/419; 361/420
[58] Field of Search ........................ 174/138 D, 138 G; 206/485, 487, 329; 361/395, 399, 400, 412, 415, 417, 419–420; 211/41

[56] References Cited

U.S. PATENT DOCUMENTS

| | | | |
|---|---|---|---|
| 3,567,998 | 3/1971 | Ammerman | 317/101 |
| 3,932,016 | 1/1976 | Ammenheuser | 361/415 |
| 4,017,770 | 4/1977 | Valtre | 361/399 |
| 4,618,915 | 10/1986 | Bury | 361/420 |
| 4,700,846 | 10/1987 | Schroeder | 361/415 |

FOREIGN PATENT DOCUMENTS

| | | | |
|---|---|---|---|
| 7433012 | 7/1975 | Fed. Rep. of Germany . | |
| 2516746 | 10/1976 | Fed. Rep. of Germany | 361/399 |
| 2616108 | 9/1977 | Fed. Rep. of Germany | 361/399 |
| 2812332 | 10/1978 | Fed. Rep. of Germany . | |
| 2732519 | 2/1979 | Fed. Rep. of Germany . | |
| 2806558 | 8/1979 | Fed. Rep. of Germany . | |
| 3146608 | 7/1983 | Fed. Rep. of Germany . | |

Primary Examiner—Gregory D. Thompson
Attorney, Agent, or Firm—Frishauf, Holtz, Goodman & Woodward

[57] ABSTRACT

The holder (1) for an electronic component (20), especially a hybrid module, is preferably a unitary plastic element having an elongated base plate (2) formed with openings (14) therein to permit insertion of terminal pins or lugs (21) projecting from the component therethrough. Two holder arms (30) project from the base plate, the holder arms having module support portions (3) and oppositely projecting posts (4). The posts fit into receiving openings (26, 27) of a printed circuit board, which receiving openings having a spacing (S) which is greater than the distance (D) between the posts so that, upon insertion of the posts in the openings the arms (30) will tilt towards each other, thus clamping a module, typically in card or board form, between the module support (3) of the arms. The holder can also form a transport holder for the module, by forming, for example, in the module a notch spaced from the upper edge, and engaging the notch (22) with a projecting rim (9) formed on the upper ends of the support portions (3) of the arms, the notch being so spaced that the terminal lugs or pins (21) then just fit into the openings (14) in the base plate, thereby protecting the pins against damage.

20 Claims, 1 Drawing Sheet

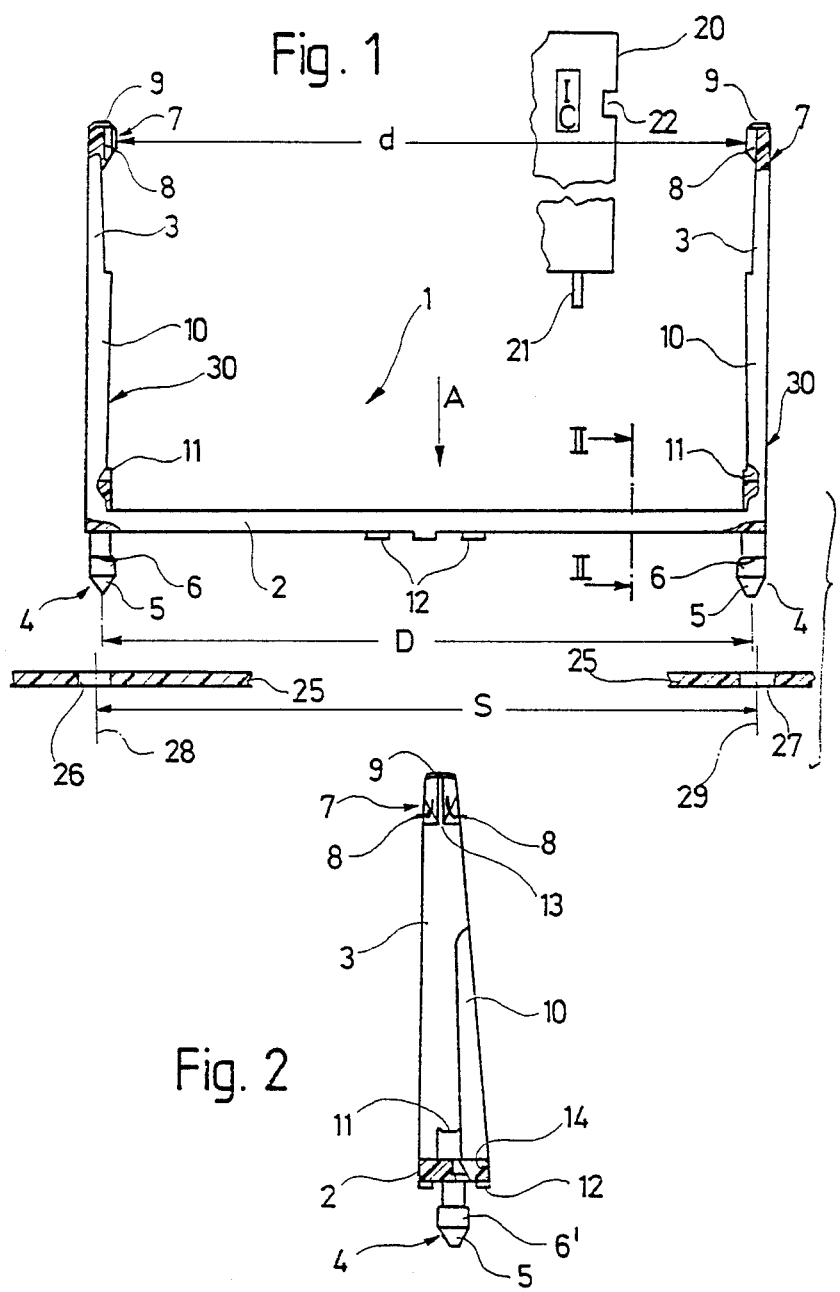

HOLDER SYSTEM FOR FREE-STANDING ELECTRONIC COMPONENTS, ESPECIALLY HYBRID MODULES

REFERENCE TO RELATED DISCLOSURE

German Patent Disclosure Document DE-OS No. 28 06 558.

The present invention relates to a holder system for free-standing electronic components, especially hybrid modules, so that the modules can be supported and also attached to circuit boards, such as printed circuit boards; and, further, to a holder which can be used as a shipping protector for the modules prior to assembly on or with a printed circuit board.

BACKGROUND

Various types of holder devices are used in combination with printed circuit boards. Such holder devices usually are employed to retain hybrid modules, circuit cards or boards or the like, and to support them perpendicularly on a printed circuit board. The hybrid modules include projecting terminal flags or spades which can be soldered or otherwise connected to the printed circuit board.

One type of holder (see, for example, German Patent Disclosure Document DE-OS No. 28 06 558) utilizes a housing which is open at one side, and from which the terminal flags or spades of the hybrid module project. The side edges of the modules, and extending at right angles to the connecting combs are guided in grooves formed at the inside of the housing. The housing is attached to the printed circuit board (PCB) by rivets.

This arrangement holds the module in position, but has the disadvantage or requiring a fair amount of material and assembly labor. The housing essentially is closed all around and such a closed housing is used to hold, for example, only a single hybrid module on the PCB. Introducing the module into the housing, and attachment of the housing by riveting on the printed circuit board, requires skilled work which is time-consuming. The terminal spades or lugs which extend from the module project from the housing in advance of assembly of the housing and the module, which easily leads to damage by bending the spades, and then difficulty and special hand work to attach the module to the circuit board. Some terminal lugs or spades may even break, and if such breakage is not discovered prior to assembly, results in expensive rejects.

Another type of holder has been proposed in which a cover plate is used spanning over the upper side of the hybrid module. Two side walls extend from the top cover plate, formed with guide grooves. A terminal wall forming a stop also projects from the cover plate. The guide grooves do not extend over the entire length of the side walls but only over a region which corresponds to the height of respective modules. Since the guide grooves correspond in length to the modules, relative movement of the modules parallel to the cover plate of the holder is prevented.

To assemble a module in the holder, the hybrid plate is first located on the side walls, parallel to the end plate. Then the module is pressed in the direction of the cover plate until the side edges of the module engage in the guide grooves of the side walls. This way of attachment is complex, labor-intensive, and requires skilled work. The pressure with which the hybrid plate is pressed into the holder can be considerable and some modules are damaged or even destroyed upon application of the engagement pressure. Prior to assembly of the holder on the printed circuit board, the contact pins of the connecting comb, that is, the connecting lugs or spades, project from the holder, which can lead to their being bent or broken.

THE INVENTION

It is an object to provide a holder for free-standing electronic components, for example hybrid modules, circuit cards or the like, which have projecting connecting spades or lugs, for example in the form of a connecting comb or strip, which is easily made, easily assembled on a printed circuit board and, further, can be used as a protective element to protect the electronic component during shipment and, especially, to protect the rather fragile and easily bent or broken components of the connecting comb.

Briefly, the holder has an essentially rectangular base plate formed with openings therein to permit insertion of the terminal lugs or spades therethrough. Two holder arms extend from the narrow sides of the base plate, each of the holder arms having module support portions extending in a first direction, and a retention post extending in a second direction opposite to the first direction, the extension post being insertable into receiving openings formed in the receiving printed circuit board.

In accordance with a preferred feature of the invention, the elongated base plate and the holder arms comprise a unitary plastic element, of a material which permits resilient tilting of the module support portions towards and away from each other. The spacing of the receiving openings in the PCB is selected to be greater than the normal spacing of the holder arms at the point of merger with the base plate, so that, upon insertion of the holder arms into the openings, the arms will be resiliently biassed towards each other to hold an electronic module therebetween. Interengaging projection-and-recess means, for example formed by projections on the posts which snap in behind the PCB when the posts are inserted in the opening securely and tightly connect the holder to the PCB. The top of the module support portions of the arms are preferably formed with a rim which overlaps the top edge of the electronic module. By merely making a notch in the side walls of the electronic modules spaced from the top by about the length of the projecting connecting lugs or spades, the module, when the rim is engaged in the notch, is securely retained in the holder, and the terminal or connection lugs or spades are then protected against damage by the base plate.

The holder structure has the advantage that it is simple, can be made of a single unitary plastic component, and easily permits introduction of the electronic component therein, while not requiring any particular tools or skill in assembly on a printed circuit board (PCB). Upon insertion of the electronic component in the holder, the surface of the component is protected against damage. The attachment posts ensure reliable retention of the component on the PCB.

In accordance with a preferred feature of the invention, the facing sides of the support portions of the arms have guide elements through which the component can be inserted. This provides for reliable holding of the component not only when the holder is engaged in a PCB, but also, for example, during shipment and transport. The component is reliably secured in the holder already before the holder is assembled on an PCB. This, then, permits shipment of the PCB already in the holder, a particular advantage for hybrid modules. The guide elements further facilitate introduction of the modules into the holder.

In accordance with a particularly preferred feature of the invention, the holder arms and the base plate are coupled elastically, to permit tilting movement of the holder arms with respect to the base plate. Such movement, especially if the entire structure is a single plastic molding, will cause attachment forces acting on the retention posts. When no forces act on the retention posts, the module support portions of the arm can tilt or spring back in their normal rest position. Upon securing the holder on a PCB, introduction of the retention posts into suitably spaced reception openings in the PCB causes forces to act on the retention posts which tend to tilt the support portions of the arms towards each other, thereby tightly gripping the electronic component, typically a hybrid module or board or card, in the holder arms. These forces are easily obtained by merely selecting the spacing of the retention posts to be smaller than the spacing of the receiving openings in the PCB.

The base plate, in accordance with a preferred feature of the invention, is formed with apertures which diverge, conically and funnel-shaped in the direction of the holder arms, so that the funnel-shaped enlargements act as guide surfaces for the terminal lugs or spades.

DRAWINGS

FIG. 1 is a side view of the holder, partly in section, and showing, in fragmentary laterally shifted form, a circuit card carrying an integrated circuit, and, also, showing in fragmentary form, cross section of a printed circuit board into which the holder can be inserted; and FIG. 2 is a section along line II—II of FIG. 1.

DETAILED DESCRIPTION

The present invention will be described in connection with holders for electrical or electronic components which are assembled in groups, to form modules; of course, the holders are also suitable for single electronic components, for integrated circuits retained on circuit cards or the like; the holder is further highly suitable for circuit board modules, and modular connecting cards with or without active and passive components thereon; it is particularly suitable for hybrid modules and the description to follow will be especially concerned with such hybrid modules retained in the holder.

Under many operating conditions, hybrid modules must be retained on a printed circuit board reliably and accurately; vibration, shock or the like must not interefere with proper function of the PCB to which the module is attached as well as of the module itself, and the connection thereto. Since, normally, the module extends at right angles to the PCB, severe torsional or bending forces would arise between the module and the PCB under shock or vibration; the holder must be capable of absorbing all such forces so that none will be applied to the delicate electrical connections between conductive portions of the PCB and the module.

The holder 1 (see FIG. 1), basically, has an essentially rectangular base plate 2 with arms 30 extending from the narrow sides of the base plate. The arms 30 have two portions, namely upwardly extending module support portions 3, and oppositely extending retention posts 4. The retention posts 4 can be introduced into holes 26, 27 formed in printed circuit board 25, upon vertically downward (with respect to FIG. 1) insertion movement of the holder 1, that is, in the direction of the arrow A. The retention posts 4 terminate in conical ends 5, which facilitates introduction into the openings 26, 27 of the PCB 25. The posts 4 can be locked in position in the openings 26, 27 by projections 6 formed on the posts 4. These projections can be in the form of projecting noses or the like, or may be formed as a continuous ring, as seen at 6' in FIG. 2. Such a ring 6' can be located on the post 4, spaced from the base plate 2. The base plate 2 is formed with seating projections 12 having a lower seating surface projecting downwardly slightly below the lower surface of the base plate 2; the spacing between the lower surfaces of the seating projections 12 and the projection 6, e.g. ring 6' respectively, corresponds to the thickness of the PCB 25.

The holder arms 30 are shown in partial section in FIG. 1. As seen in the upper sectional representation of FIG. 1, a guide portion 7 is formed at the upper ends of the module support portions 3 of the arms 30, which defines two outer guide surfaces 8 (see FIG. 2). The upper end of the guide surface 8 terminate in an abutment ridge or rib 9. A guide rail 10 is provided on the support portions 3 which merges with a lower guide surface 11 forming a stop.

The seating projections 12 are formed as projections extending from the base plate 2.

The sectional view of FIG. 2 also illustrates the right (with respect to FIG. 1) holder arm 30 in plan view.

The module support portion 3 of the holder arm 30 has the same width as the base plate 2 at the lower side thereof. It narrows, tapering, in the direction of the guide portion 7 and surfaces 8. The two guide surfaces 8, formed by projections on the support portion 3, have inwardly merging tapering surfaces to define a groove which terminates at the upper end in the rim or ridge 9. The ridge 9 can also be formed as an inwardly projecting rib.

The lower guide surface 11 is also seen in FIG. 2, located by some distance above the base plate 2. The upper edge of the guide surface 11 is U-shaped or trapezoidal. One of the side edges of the lower guide surface 11 merges in the guide rail 10, which extends upwardly to about half the height of the module support portion 3 of the holder arm 30 and then runs out at the lateral side of the respective support portion.

The base plate 2 is formed with at least one, preferably two rows of holes or openings, which receive the terminal or connecting or contact pins, lugs or spades 21 projecting from the plate-like module 20 (FIG. 1). The upper sides of the openings 14 diverge conically in the direction of a module 20, shown in highly schematic form in FIG. 1. This substantially facilitates insertion of the terminal or connecting pins 21 of the module. The base plate 2, thus, is used not only as a mechanical connection of the holder arms 3, but also as a threading or attachment assist upon assembly of the hybrid module.

The distance d between the module support portions 3 in the region of the guide portion 7 is slightly less than the width of a module 20 to be assembled therein.

ASSEMBLY AND OPERATION

To assemble the holder 1 in a PCB 25, it is moved in the direction of the arrow A to introduce the conical ends 5 of the posts 4 into the openings 26, 27, respectively. The projections 6, e.g. the ring projections 6' (FIG. 2) hold the posts 4 in position on the PCB 25.

Preferably, the holes 26, 27 are just large enough to accept the entire size of the posts 4, including the projections 6 or 6'.

In accordance with a feature of the invention, the spacing S of the center lines 28, 29 of the holes 26, 27 in the PCB 25 is somewhat larger than the distance D between the center lines of the posts 4 of the holder 1. In order to permit insertion of the posts 4, they must be slightly bent apart. This causes posts 4 to be spread and, upon release after spreading, reliable engagement of the projections 6, e.g. the rings 6' against the lower surface of the PCB 25. The projections 6, 6' and the holes 26, 27 thus form an interengaging projection-and-recess coupling. The side edges of the module, upon insertion in the guide portion 7, first engage between the surfaces 8 and then run in the groove 13. As can be seen from FIG. 2, the lower edge of the module is guided by the guide rail 10 until it engages the end of the lower guide surface 11, which forms an abutment therefor. As the module 20 is moved in the direction of the arrow A into the holder, the projecting contact pins 21 of the connecting comb are received in the conically enlarged outer regions of the openings 14. The length of the holder arms 3 is so selected that the abutment rim 9 extends over the side edge and overlaps the upper longitudinal edge of the module 20, when the lower edge of the module is engaged against the abutment or stop formed by the lower guide surface 11. This provides for reliable positioning of the module 20 in the holder 30.

To use the holder as a protective element during shipment, the module 20 is formed with at least one lateral notch 22, in which the projecting ridge or rim 9 can engage. The spacing of the notch 22 from the upper edge of the module 20 is so selected that the contact pins 21 of the connecting comb just extend into the upper regions of the openings 14 of the base plate 2. Thus, when the rim 9 engages in the notch 22, the pins 21 are protected by already being partly located within the openings 14. The module 20, inserted into the holder 1 up to the notch 22 can, thus, be reliably transported and handled without danger of damage to the pins 21. The holder, thus, can be used as a protective element during transport or storage for the hybrid module 20 even before it is assembled to a PCB 25.

The bias force of the holder arms 3 is preferably so selected that once a module is introduced into the guide portion 7, it can no longer shift, even if the rim 9 has not yet engaged about the side edges. If that force is sufficient, the lateral notches 22 need not be used and, with sufficient bias force, the arms 30 retain the module frictionally in position with the pins 21 protected by the upper regions of the openings 14.

The spacing D between the posts is preferably so selected that it is smaller than the spacing S of the openings 26, 27, which form the assembly openings in the PCB 25, into which the holder 1 is to be attached. Upon assembly, the posts 4 are deflected outwardly. Due to the elastic coupling of the holders 30 on the base plate 2, the posts 4 can deflect about the connecting point or junction or merger zone with the base plate. Spreading the posts 4 causes the support portions 3 of the holder arms 30 to tilt towards each other, or to be subjected to a bias tilting force towards each other. After insertion of the holder 1 in a PCB, the spacing d of the support portions 3, especially in the region of the guide portion 7, will be somewhat smaller than the width of the module 20 to be inserted therein. To insert a module into a holder 1 which has already been inserted into a PCB 25, the support portions 3 of the arms 30 must be spread apart, causing a bias force in the holder arms against such movement. Any hybrid board 20 introduced between the holder arms 30, then, will be reliably and securely clamped in position.

It is equally possible to assemble the combination of the holder with a hybrid circuit 20 therein in a PCB. Upon insertion of such a combination into the PCB 25, the posts 4 are spread, as explained above, which causes a clamping force to be exerted against the module, and enhances the holding force applied against the module 1 upon insertion into the PCB 25.

The system of the present invention is essentially immune against tolerances in manufacture. For example, if the spacing D between the posts 4, or the spacing S between the holes 26, 27 in the PCB 25 is subject to tolerance, no ontoward consequences may occur; the only change is in the spring force exerted by the support portions 3 of the holder arms 30 on the module plate 20. In spite of manufacturing tolerances, and even if there should be an inadvertent concatenation of non-compensating tolerances, the module plate 20 will always be reliably held in position by the projecting ridge or rib 9 which engages over the upper edge of the plate 20. This ensures that the module 1 and the holder cannot come loose from a PCB 25 upon handling of the PCB.

The arms 30 can be constructed as relatively narrow, and hence space-saving elements.

If it should be necessary to remove a component 20 from the holder, it is only necessary to spread the support portions 3 apart until the rim 9 is released from overlap over the upper edge of the plate 20 so that the entire module can be removed. The support portions 3 then, resiliently, will tilt against each other. If it is desired to remove the holder, the arms 3 are moved toward each other even more, so that the projections 6 e.g. the rims 6' will be released from beneath the PCB 25 and the holder can be removed, without exertion of any force against the PCB and without damage to the projection or rim.

In accordance with a preferred feature of the invention, posts 4 are selected to have different diameters, and, likewise, the openings 26, 27 have different diameters. This reliably prevents erroneous assembly of the holder 1, that is, an end-for-end or 180° twist of the holder with respect to the appropriate position.

The holder 1 is preferably made as a unitary plastic element, or the holder 1 can be made in form of a base plate 2 on which the holder arms 3 are directly formed on the base plate. The material is preferably so selected that a tilting or tipping movement of the holder arms 3 with respect to the base plate 2 is possible without damage of the junction or merging position between the holder plate 2 and the arms 30.

Various changes and modifications may be made within the scope of the inventive concept.

We claim:

1. A holder adapted to hold a free-standing electric or electronic component (20), especially a hybrid module or circuit card, wherein the component has a plurality of terminal lugs projecting therefrom, said holder being adapted for attachment on a circuit board (PCB) (25) formed with receiving openings (26, 27) therein, said holder comprising an essentially rectangular elongated base plate (2) formed with openings (14) therein adapted to permit insertion of terminal lugs of a component therethrough; and two holder arms (30) extending from the narrow sides of the base plate, each holder arm having a module support portion (3) extending in a first direction, and a retention post (4) extending in a second direction which is opposite to said first direction, said posts being adapted for insertion into the receiving openings (26, 27) of the circuit board; and wherein the holder arms (30) are elastically connected with the base plate (20), and of sufficient elasticity to transfer a tipping or tilting movement applied to said posts on said module support portions (30).

2. The holder of claim 1, wherein the module support portions (3) of the holder arms (30) are formed with guide means (7) at sides thereof facing each other.

3. The holder of claim 1, wherein said support portions (3) include projecting ridge or rib means (9) located adjacent terminal ends of said support portions (3) and extending in a direction facing each other, said support portions being adapted for engagement with an electronic component (20).

4. The holder of claim 1, further including locking means (6) formed on the posts (4) adapated for locking the posts on a circuit board (25).

5. The holder of claim 4, wherein said locking means comprises projecting means (6, 6') extending from said posts and spaced from the base plate.

6. The holder of claim 5, wherein said projecting means comprise projecting noses (6).

7. The holder of claim 5, wherein said projecting means comprises a continuous ring or bulge (6').

8. The holder of claim 1, further including guide and stop means (11) formed on said module support portions adapted for receiving an edge of and electronic component (20).

9. The holder of claim 1, wherein said openings (14) formed in the elongated base plate (2) are formed with diverging enlargements which diverge towards the electronic component (20) for guiding the lugs (21) through said openings.

10. The holder of claim 1, wherein said posts (4) are of different diameter.

11. The holder of claim 1, wherein said holder comprises a unitary element of resilient plastic material.

12. A holder adapted to retain a free-standing electronic component (20), especially a hybrid module, wherein the component has a plurality of terminal lugs (21) projecting therefrom,
said holder comprising
an essentially rectangular elongated base plate (2) formed with openings (14) therein adapted to permit insertion of terminal lugs of an electronic component therethrough;
two holder arms (30) extending from the narrow sides of the base plate, each holder arm having a module support portion (3) extending in a first direction, and a retention post (4) extending in a second direction which is opposite to said first direction, said retention posts being adapted for insertion into receiving openings (26, 27) of a printed circuit board (PCB) (25);
and wherein said holder arms (30) are resiliently connected with the base plate (2) and resiliently biassed towards each other to provide a resilient clamping force against an electronic component inserted between said holder arms.

13. The holder of claim 12, including
at least one projection wherein at least one of said support portions terminates in one of said at least one projection (9) facing the other arm,
in combination with an electronic component (20) formed with a notch (22) positioned in said component such that, when the notch (22) is engaged by said at least one projection (9), the terminal lugs will just fit into the openings (14) of the base plate whereby said terminal lugs will be protected from bending or damage and said component is securely held in predetermined position in said holder.

14. The holder of claim 13, in combination with said electronic component, wherein said electronic component comprises a plate-like structure, said electronic component being inserted in said holder in a position in which said terminal lugs (21) just extend into said openings (14) in the base plate (2) whereby the terminal lugs will be protected against damage or breakage.

15. The holder of claim 12, wherein said holder comprises a unitary element of resilient plastic material.

16. The holder of claim 12, in combination with an electronic component (20)
wherein said electronic component comprises a plate-like structure, said electronic component being inserted in said holder;
and wherein said electronic component (20) and said support portions (3) of the holder arms (30) include interengaging projection and recess (22) means, respectively for locating said electronic component in said holder arms in a predetermined position.

17. The combination of claim 16, wherein said holder comprises a unitary element of resilient plastic material.

18. A holder system adapted for holding a free-standing electronic component (20), especially a hybrid module, circuit card or the like on a circuit board, said system including
a circuit board (25) formed with receiving openings (26, 27) therein, and a holder; and
wherein the holder is adapted to hold a component having a plurality of terminal lugs, pins or spades projecting therefrom,
wherein said holder comprises
an essentially rectangular elongated base plate (2) formed with openings (14) therein adapted to permit insertion of the terminal lugs, pins or spades of a component therethrough;
two holder arms (30) extending from the narrow sides of the base plate, each holder arm having a module support portion (3) extending in a first direction, and a retention post (4) extending in a second direction which is opposite to said first direction, said posts being adapted for insertion into said receiving openings (26, 27);
said base plate (2) and said holder arms (30) comprising an element of resilient plastic of sufficient resiliency to permit tilting of said holder arms (30) towards and away from each other;
wherein the spacing (D) of the center axis of said retention posts (4) is less than the spacing (S) of the center axis of said receiving openings (26, 27) of said circuit board (25), whereby the arms (30) will be resiliently biased towards each other;
interengaging means (6) are formed on said posts for engagement with said circuit board (25) upon insertion of said holder (1) in said circuit board; and
guide means (7, 8, 13; 11) are provided for retaining and guiding the component (20) on said holder (1)

and the component will be held and retaining on said holder by resilient bias of said module support portions (3) of said holder arms (30) towards each other.

19. The system of claim 18, wherein the terminal ends of said module support portions (3) of said holder arms (30) remote from said base plate (2) are formed with projecting rims or ribs (9) facing each other, said ribs or rims being biassed towards each other by resilient tilting movement of said holder arms due to the difference in the spacing of the center axes of said posts (4) and the center axes of said receiving openings (26, 27) in said printed circuit board, at least one of said ribs or rims being adapted to engage over a surface of the electronic component.

20. The system of claim 19, wherein said surface which is engaged by at least one of said ribs or rims (9) comprises at least one of: a side surface of the electronic component; an upper edge of the electronic component; a notch (22) in a side surface of the electronic component.

* * * * *